(12) United States Patent
Hunter et al.

(10) Patent No.: US 7,112,763 B2
(45) Date of Patent: Sep. 26, 2006

(54) METHOD AND APPARATUS FOR LOW TEMPERATURE PYROMETRY USEFUL FOR THERMALLY PROCESSING SILICON WAFERS

(75) Inventors: Aaron Hunter, Santa Cruz, CA (US); Rajesh S. Ramanujam, Cupertino, CA (US); Balasubramanian Ramachandran, Santa Clara, CA (US); Corina Elena Tanasa, Mountain View, CA (US); Tarpan Dixit, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/974,003

(22) Filed: Oct. 26, 2004

(65) Prior Publication Data

US 2006/0086713 A1 Apr. 27, 2006

(51) Int. Cl.
*F27D 11/00* (2006.01)
(52) U.S. Cl. ............... 219/411; 219/390; 219/405; 392/416; 392/418; 118/724; 118/725; 118/50.1
(58) Field of Classification Search ............... 219/390, 219/405, 411; 392/416, 418; 118/724, 725, 118/50.1
See application file for complete search history.

(56) References Cited

U.S. PATENT DOCUMENTS

| | | | |
|---|---|---|---|
| 6,007,241 A | 12/1999 | Yam et al. | 374/131 |
| 6,151,446 A * | 11/2000 | Hunter et al. | 392/416 |
| 6,179,466 B1 | 1/2001 | Peuse et al. | 374/128 |
| 6,183,130 B1 | 2/2001 | Adams et al. | 374/131 |
| 6,376,804 B1 | 4/2002 | Ranish et al. | 219/390 |
| 6,406,179 B1 | 6/2002 | Adams et al. | 374/131 |
| 6,775,471 B1 * | 8/2004 | Blersch et al. | 392/407 |
| 6,839,507 B1 * | 1/2005 | Adams et al. | 392/416 |
| 6,847,012 B1 * | 1/2005 | Hauf | 219/390 |

OTHER PUBLICATIONS

P. J. Timans, "Emissivity of silicon at elevated temperatures", *J. Appl. Phys.*, vol. 74, No. 10, Nov. 15, 1993, 6353-6364 pp.

* cited by examiner

*Primary Examiner*—Shawntina Fuqua
(74) *Attorney, Agent, or Firm*—Charles S. Guenzer, Esq.

(57) ABSTRACT

A rapid thermal processing (RTP) system including a transmission pyrometer monitoring the temperature dependent absorption of the silicon wafer for radiation from the RTP lamps at a reduced power level. A look-up table is created relating unnormalized values of photodetector photocurrents with wafer and radiant lamp temperatures. A calibrating step measures the photocurrent with known wafer and lamp temperatures and all photocurrents measured thereafter are accordingly normalized. The transmission pyrometer may be used for closed loop control for thermal treatments below 500° C. or used in the pre-heating phase for a higher temperature process including radiation pyrometry in closed loop control. The pre-heating temperature ramp rate may be controlled by measuring the initial ramp rate and readjusting the lamp power accordingly. Radiation and transmission pyrometers may be included in an integrated structure with a beam splitter dividing radiation from the wafer.

27 Claims, 6 Drawing Sheets

METHOD AND APPARATUS FOR LOW TEMPERATURE PYROMETRY USEFUL FOR THERMALLY PROCESSING SILICON WAFERS

FIELD OF THE INVENTION

The invention relates generally to thermal processing of semiconductors. In particular, the invention relates to rapid thermal processing (RTP) of silicon wafers.

BACKGROUND ART

Rapid thermal processing (RTP) is a term applied to several types of thermal processes including annealing, dopant activation, oxidation, and nitridation among others. The aforementioned processes are typically performed at relatively high temperatures above about 1000° C. It can be further applied to etching and chemical vapor deposition in the presence of precursor or etching gases. The latter processes are conventionally performed in an RTP chamber at somewhat lower temperatures of between 500° and 800° C. RTP typically depends upon an array of high-intensity incandescent lamps fit into a lamphead and directed at the substrate being processed. The lamps are electrically powered and can be very quickly turned on and off and a substantial fraction of their radiation can be directed to the substrate. As a result, the wafer can be very quickly heated without substantially heating the chamber and thereafter can be nearly as quickly cooled once the power is removed from the lamps. Thereby, the processing time at a predetermined temperature can be more closely controlled and the total thermal budget can be reduced. Furthermore, the total processing time can be reduced, thereby increasing throughput.

FIG. 1 schematically illustrates in cross section an RTP reactor 10 described by Ranish et al. in U.S. Pat. No. 6,376,804, incorporated herein by reference and generally representative of the Radiance RTP reactor available from Applied Materials, Inc. of Santa Clara, Calif. The reactor 10 includes a processing chamber 12, a wafer support 14 located within the chamber 12, and a lamphead 16 or heat source assembly located on the top of the chamber 12, all generally symmetrically arranged about a central axis 18.

The processing chamber includes a main body 20 and a window 22 resting on the main body 20. The window 22 is made of a material that is transparent to infrared light, for example, clear fused silica quartz.

The main body 20 is made of stainless steel and may be lined with quartz (not shown). An annular channel 24 is formed near the bottom of the main body 20. The wafer support 14 includes a rotatable magnetic rotor 26 located within the channel 24. A quartz tubular riser 28 rests on or is otherwise coupled to the magnetic rotor 26 and an edge ring 30 composed of silicon-coated silicon carbide, opaque silicon carbide or graphite rests on the riser 28. During processing, a wafer 32 or other substrate rests on the edge ring 30. A rotatable magnetic stator 34 is located externally of main body 20 in a position axially aligned with the magnetic rotor 24 and is magnetically coupled to it through the main body 18. An unillustrated motor rotates the magnetic stator 34 about the central axis 18 and thereby rotates the magnetically coupled rotor 26 and hence rotates the edge ring 28 and the supported wafer 30. Three or four lift pins 36 are slidably sealed to a reflector plate 38 forming a bottom wall of the main body 20. An unillustrated mechanism lifts and lowers all the lift pins 36 to selectively engage the wafer 22 to lower and raise it to and from the edge ring 30 and to and from a unillustrated paddle used to transfer of the wafer 22 into and out of the chamber 12.

The quartz window 22 rests on an upper edge of the main body 18 and an O-ring 40 located between the window 22 and the main body 20 provides an air-tight seal between them. The lamphead 16 overlies the window 22. Another O-ring 42 located between the window 22 and the lamphead 16 provides an airtight seal between them. Clamps 44 in conjunction with the O-rings 40, 42 thus seals the lamphead 16 to the main body 20.

The lamphead 16 includes a plurality of lamps 46 that are supported by and electrically powered through electrical sockets 48. The lamps 46 are preferably high-intensity incandescent lamps that emit strongly in the infrared such as tungsten halogen bulb having a tungsten filament inside a quartz bulb filled with a gas containing a halogen gas such as bromine and diluted with an inert gas to clean the quartz bulb. Each bulb is potted with a ceramic potting compound 50, which is relatively porous. The lamps 46 are located inside vertically oriented cylindrical lamp holes 52 formed in a reflector body 54. The open ends of the lamp holes 52 of the reflector body 54 are located adjacent to the window 22 with the lamps 46 separated from the window 22.

A liquid cooling channel 56 is formed within the reflector body 54 to surround each of the lamp holes 52. A coolant, such as water, introduced into the cooling channel 56 via an inlet 60 and removed at an outlet 62, cools the reflector body 54 and flowing adjacent the lamp holes 52 cools the lamps 46.

Thermal sensors such as seven or more pyrometers 70 are optically coupled by light pipes 72, such as sapphire rods, to respective apertures 72, which are formed through and are disposed and spaced across the radius of the reflector plate 38. Typically the rigid sapphire light pipes 72 and pyrometers are supported in the main body 20 but there may be an intermediate flexible optical fiber or light guide. The pyrometers 70 detect a temperature or other thermal property of a different radial portion of the lower surface of the wafer 30 and edge ring 30, as Peuse et al. describe in U.S. Pat. No. 5,755,511. Adams et al. describe such a pyrometer in U.S. Pat. No. 6,406,179, incorporated herein by reference in its entirety. The pyrometer 70 is more particularly a radiation pyrometer and includes an optical narrow-band filter having a passband of about 20 nm at a wavelength less than 950 nm, that is, at a photon energy somewhat above the silicon band gap of about 1.1 eV (1.1 μm), alternately expressed as photon wavelength below the band gap wavelength of the silicon wafer. Such filters are easily formed as multi-layer interference filters. Thereby, the silicon wafer 32 absorbs the shorter-wavelength visible radiation emitted from the lamps 46 so that the pyrometer 70 is sensitive to the blackbody radiation emitted from the wafer 32 rather than the radiation from the lamps 46.

The pyrometers 72 supply temperature signals to a lamp power supply controller 76, which controls the power supplied to the infrared lamps 46 in response to the measure temperatures. The infrared lamps 46 may be controlled in radially arranged zones, for example, fifteen zones, to provide a more tailored radial thermal profile to account for thermal edge effects. The pyrometers 72 together provide signals indicative of a temperature profile across the wafer 22 to the power supply controller 76, which controls the power supplied to each of the zones of the infrared lamps 46 in response to the measured temperatures, thus providing a closed loop thermal control.

The main body 20 of the processing chamber 12 includes a processing gas inlet port 80 and a gas outlet port 82. In use, the pressure within the processing chamber 12 can be reduced to a sub-atmospheric pressure prior to introducing a process gas through the inlet port 80. A vacuum pump 84 evacuates the process chamber 86 by pumping through a port 76 and a valve 88. The pressure is typically reduced to between about 1 and 160 torr. Certain processes, however, can be run at atmospheric pressure, though often in the presence of a specified gas, and the process chamber does not need to be evacuated for such processes.

A second vacuum pump 90 reduces the pressure within the lamphead 16, particularly when the processing chamber is pumped to a reduced pressure to reduce the pressure differential across the quartz window 22. The second vacuum pump 90 reduces the pressure within the lamphead 16 by pumping though a port 92 including a valve 94. The port 92 is in fluid communication with an interior space of the reflector body 54 including the lamp holes 52.

A pressurized source 98 of a thermally conductive gas, such as helium, fills the lamphead 16 with the thermally conductive gas to facilitate thermal transfer between the lamps 46 and the liquid cooling channels 56. The helium source 98 is connected to the lamphead 16 through a valve 100 and port 102. The thermally conductive gas is introduced into a gas manifold 104 formed between a lamphead cover 106 and the base of each lamp 46. Opening the valve 100 causes the gas to flow into the manifold 104. Since the lamp potting compound 50 is relatively porous, the thermally conductive gas flows through the potting compound 50 and in the gap between the walls of the lamp 46 and the lamp hole 52 to cool the lamps 46.

The described RTP chamber, however, suffers some drawbacks in its use at lower temperatures. The typical radiation pyrometer used for silicon RTP includes a silicon photodiode detector, which detects the intensity of usually a narrow bandwidth of the Plankian radiation spectrum emitted from a hot body and determines the temperature of that body from the detected intensity. However, pyrometry is generally used for measuring high temperatures, for example, above 500 or 800° C. In the configuration of RTP reactors in which the chamber parts are relatively warm and there is light leakage from radiant bulb, conventional pyrometry is relatively ineffective at wafer temperatures of less than about 450° C. Photocurrents of a conventional pyrometer exposed to a 350° C. body are in the neighborhood of 0.8 pA, a level easily overwhelmed by thermal and electronic noise in a typical RTP environment. Furthermore, the wafer is partially transparent at these temperatures and the chamber is not light tight. It has been observed that immediately after the incandescent lamps are turned on in the presence of a cold wafer, the pyrometers immediately register about 350° C. from the direct and indirect lamp radiation.

Low-temperature control of wafer temperatures occurs in at least two situations for RTP. In high-temperature RTP, the higher wafer temperatures are very finely controlled by a closed loop control system using the radiation pyrometers, which, as explained above, are effective only above about 450° C. To reach this temperature, however, the wafer must first be heated under an open loop control system in which predetermined amounts of current are supplied to the radiant lamps. When the pyrometers detect that the temperature has reached a lower detection limit for the radiant pyrometers, thermal control switches to the closed loop system. The pre-heating during the open-loop period is not closely monitored beyond typically a switch off condition. As a result, temperature gradients or excessive heating rates may occur. The wafer may become misshapen during the pre-heating into a domed or potato-chip shape that prevents effective RTP at yet higher temperatures. It has thus been necessary to closely optimize the pre-heating conditions, particularly the distribution of zonal heating to achieve uniform preheating. Such pre-heating optimization has conventionally required a skilled engineer to experiment with a large number of wafer to establish a pre-heating recipe which avoids warpage or other deleterious results. However, the optimized recipe strongly depends on the features already established on the wafer. Except in the situation of very long production runs, it is infeasible to optimize for each level of each chip design. Instead, the optimization is performed on a few classes of unpatterned stock wafers having a top layer of a given type of material, for example, either metal or oxide. For production, the pre-heating recipe is selected for a similar top layer. Generally, this approach has proven unsatisfactory and results in uncertain pre-heating rates and other uniformities requiring yet further adjustments.

A demand has arisen for RTP performed at temperatures below 500° C. and even below 250° C. to nearly room temperature, for example, in nickel, cobalt, or titanium silicide contacts being envisioned for future generations of integrated circuits. It would be convenient to apply conventional radiation pyrometry to these advanced processes requiring relatively low thermal treatment temperatures. It is conceivable to design an automated low-temperature RTP chamber with cold walls and low-temperature radiation pyrometers, but it is more desirable to adapt commercialized high-temperature RTP chambers for low-temperature processing. It is further desired to provide an RTP chamber that can be used for both low-temperature and high-temperature processing so that the same chamber can be used for different processing steps.

Hunter et al. have described in U.S. Pat. No. 6,151,446, incorporated herein by reference in its entirety, a transmission pyrometer useful for determining when a wafer supported on lift pins induces enough photocurrent in a photodetector to generally indicate that the wafer has achieved a chamber temperature before the wafer is lowered onto the edge ring. The transmission pyrometer includes some sort of filtering effective within a band near the silicon band gap. As the silicon wafer warms up, its band gap energy decreases (wavelength increases). The transmission pyrometer is intended to detect the radiation from the radiant heating lamps, usually held at a low intensity, as filtered by the silicon wafer. As the silicon band gap passes into or out of the detector's bandwidth, the detector signal significantly changes, thereby providing an indication of the temperature of the silicon wafer. The Hunter transmission pyrometer was incorporated into the chamber's lift pins to determine when it is safe to lower the wafer onto the warm edge ring. It is described as operating only up to about 400° C. Although Hunter provides some feedback control of the lamp power, closer and finer control of wafer temperature is desired.

SUMMARY OF THE INVENTION

One aspect of the invention includes using a transmission pyrometer to measure temperatures of silicon wafers of less than 500° C. and even less than 250° C. in a rapid thermal processing chamber. Transmission pyrometers detect the optical radiation from the radiant heating lamps as it is filtered by the silicon wafer. The absorption of the silicon in some wavelength bands strongly depends upon the wafer temperature. The temperature measurement may be used for thermal processing at no more than such temperatures or may be used to control the pre-heating up to the point that a radiation pyrometer can measure the wafer temperature, for example, at 400 to 500° C., above which the heating is controlled by a closed loop using the radiation pyrometers.

A low-temperature transmission pyrometer useful below about 350° C. may be implemented with a silicon photodiode with little or no filtering in the wavelength band between 1 and 1.2 µm. A transmission pyrometer useful in a wavelength range extending to 500° C. includes an InGaAs diode photodetector and a filter blocking radiation above about 1.2 µm. Radiation and transmission pyrometer may be integrated into a structure including an optical splitter receiving radiation from a light pipe or other optical light guide and dividing the radiation into respective beams directed at the transmission pyrometer and the filter of the radiation pyrometer.

The transmission pyrometry is advantageously performed knowing the general characteristics relating power delivered to the radiant heating lamp or other electrical characteristic thereof, the wafer temperature, and the photocurrent of a transmission pyrometer. In one method of compiling the characteristics, the photocurrent can be calculated within a constant from lamp and detector characteristic. A two-dimension table may be filled with the unnormalized photocurrent as function of wafer and lamp temperature or other methods of retrieving a known characteristic may be used. A initial measurement of the photocurrent at a known temperature of the wafer allows the tabular data to be normalized for the wafer being processed. Thereafter, when the pyrometer photocurrent is measured at a known lamp temperature or resistance, the table is consulted to obtain the corresponding wafer temperature.

An integrated dual pyrometer may be formed in a single housing and include both a transmission pyrometer and a radiation pyrometer. A single light guide supplies light at the backside of the wafer. A beam splitter divides the received light to the two pyrometers. The housing may be supported on the RTP reflector plate.

DETAILED DESCRIPTION OF THE PREFERRED EMBODIMENTS

Figure 1:
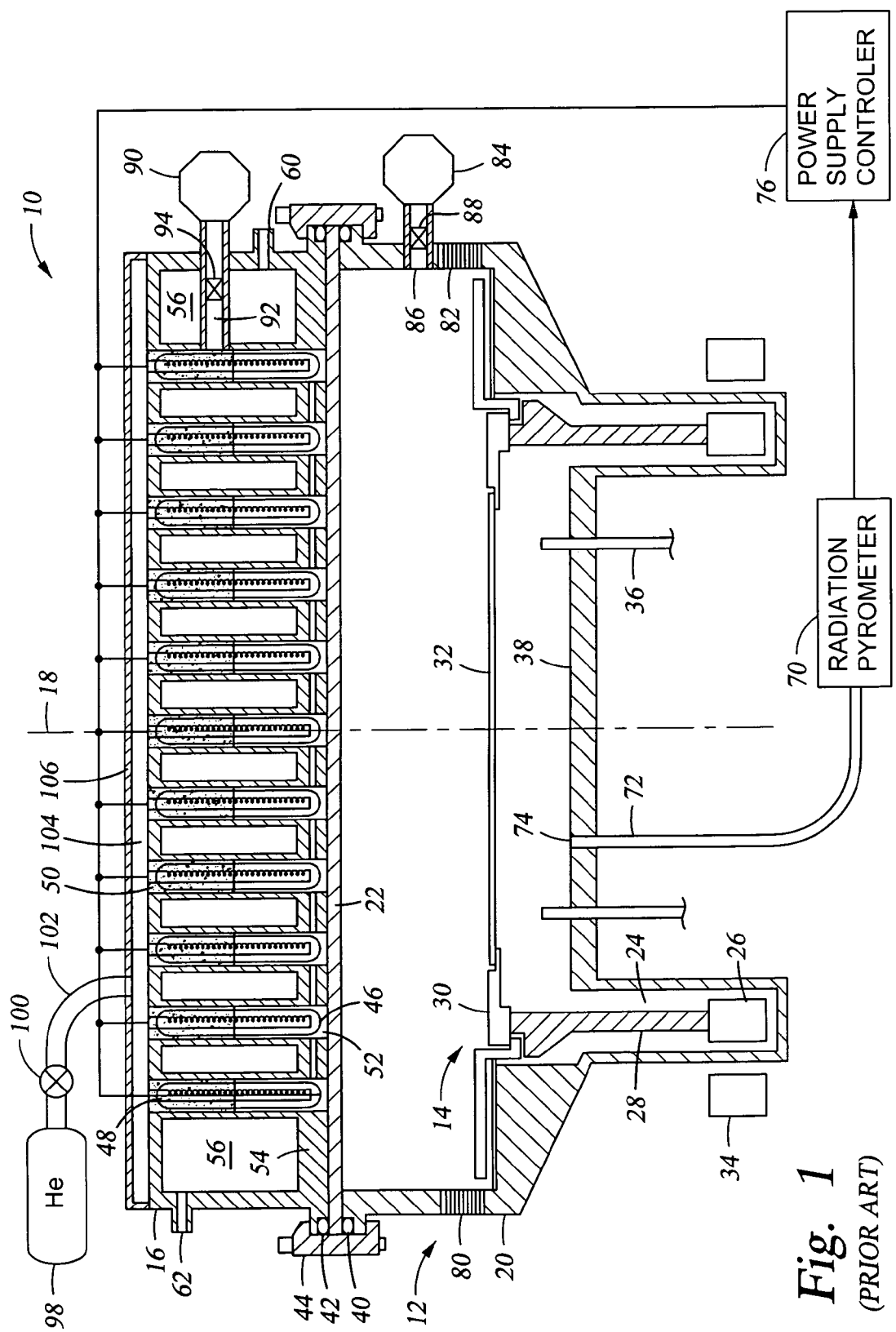
FIG. 1 is a schematic cross-sectional view of a conventional rapid thermal processing (RTP) chamber including at least one radiation pyrometer.
Figure 2:
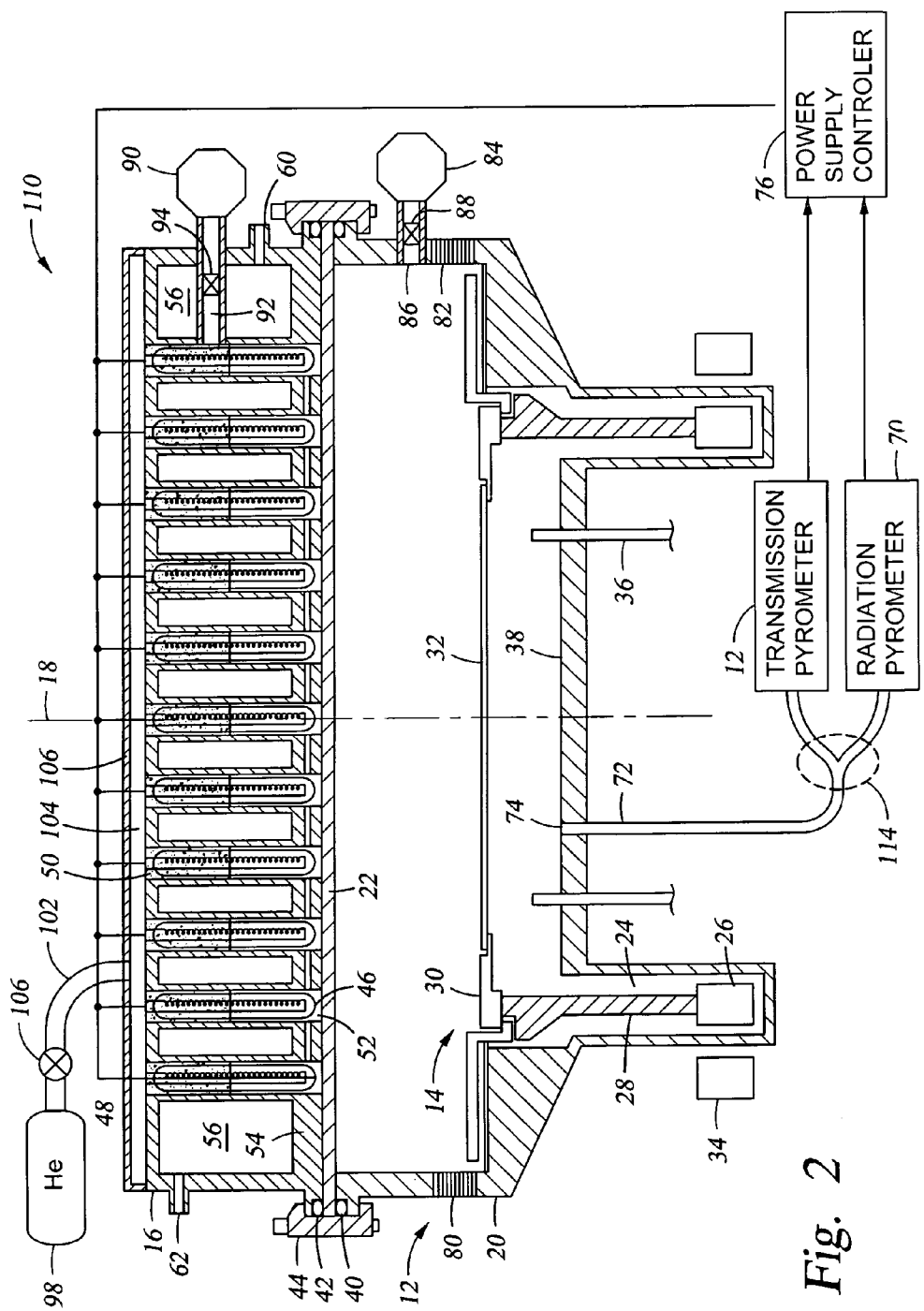
FIG. 2 is a schematic cross-sectional view of one embodiment of an RTP chamber of the invention including both a transmission pyrometer and a radiation pyrometer.

One embodiment of a rapid thermal processing (RTP) chamber 110 of the invention is schematically illustrated in the cross-sectional view of FIG. 2. It includes at least one transmission pyrometer 112. Although some aspects of the invention can be practiced with transmission pyrometry alone, advantageously the inventive chamber 110 additionally includes one or more radiation pyrometers 70. The two pyrometers 70, 102 may be included in a single system receiving optical radiation from the light pipe 72 and an optical splitter 104 divides the received radiation between the two pyrometers 70, 102. As mentioned previously, the radiation pyrometer 70 includes a narrow band filter at a sub-micron wavelength, that is, passing photons having energies greater than the silicon band gap. The radiation pyrometer 70 is thus effective at measuring the blackbody radiation temperature at the back side of the wafer 32 since the silicon wafer 32 blocks the shorter wavelength light from the lamps 46. On the other hand, the transmission pyrometer 70 is sensitive to longer-wavelength light, in particular light in the neighborhood of the silicon band gap at the wafer temperatures of interest or somewhat longer.

Figure 3:
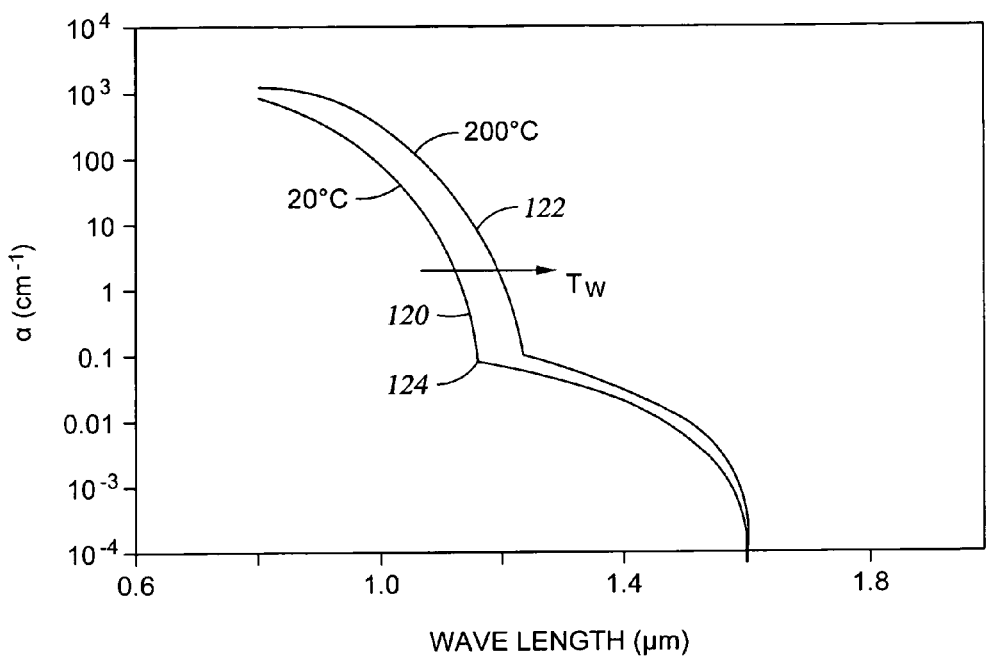
FIG. 3 is a graph showing the shift of the silicon absorption edge with temperature.

The transmissivity or transmission coefficient τ for optical radiation of a particular wavelength passing a uniform wafer is given by $$\tau(\alpha,\chi)=e^{-\alpha\chi}, \qquad (1)$$

where α is the absorption coefficient and χ is the thickness of the wafer. The absorption coefficient of silicon near its band gap has a known temperature dependence, shown in the graph of FIG. 3 for room temperature (20° C.) and 200° C. The steeply sloping portions are identified with the absorption edge of the optical band gap, which depends upon both the thermal change of the thermally activated free carriers and phonon contributions. The absorption edge shifts to longer wavelengths (smaller photon energies) with increasing wavelength.

The spectral filtering required for a transmission pyrometer is different from that for a radiation pyrometer. The transmission pyrometry filter and photodetector together provide a spectral response that needs to be sensitive to the wavelength of the absorption gap at the wafer temperatures of interest. This requirement varies according to whether the transmission pyrometer needs measure only low temperatures below 250° C. or whether temperatures up to 450° C. and somewhat above need to be measured. However, to maintain a reasonable signal-to-noise ratio, only a limited bandwidth of the blackbody radiation spectrum should be detected.

A silicon photodetector with no optical filtering can perform this function below about 250 or 350° C. A silicon photodetector is insensitive to radiation having a wavelength longer than about 1.1 µm. The wafer absorption edge is rising from 1 µm toward 1.2 µm as the wafer heats from room temperature to 350° C. Therefore, the net effect is a somewhat narrow pass band. However, at wafer temperatures higher than about 350° C., the absorption edge is beyond the detection limits of the silicon photodetector so that any further increases in the absorption edge wavelength are not readily detected. Thus, for operation with higher wafer temperatures, it is desired to use a photodetector sensitive to longer wavelengths. An example of such a detector is an InGaAs diode photodetector, which has a detection band between about 0.9 and 1.7 µm. In order to avoid that large contribution up to 1.7 µm, the InGaAs should be used with a low-pass filter passing wavelengths below 1.2 or 1.3 µm, that is, passing mostly radiation having a wavelength less than the band gap wavelength of the silicon wafer at the highest temperature measured by the transmission pyrometer and cutting off most of the Plankian spectrum above this band gap wavelength. Additionally, the filter may be a bandpass filter cutting off radiation about 1 or 1.1 µm.

Figure 4:
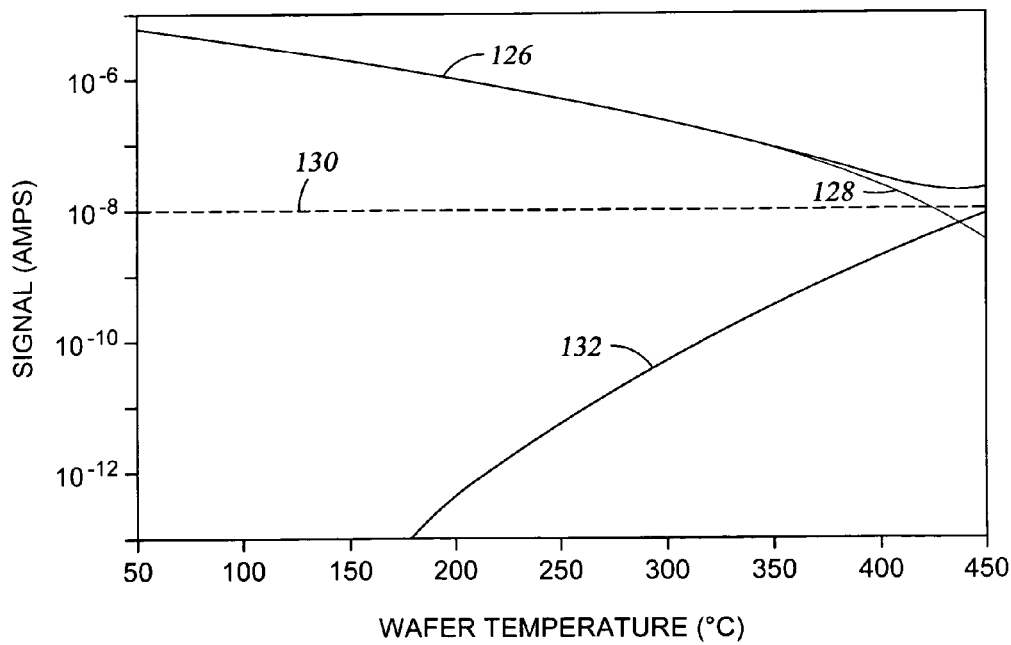
FIG. 4 is a graph illustrating the different contributions to the photocurrent in a transmission pyrometer as a function of wafer temperature.

The regime of operation is explained with reference to the graph of FIG. 4. Line 126 represents the total photocurrent from the transmission pyrometer as a function of wafer temperature for one setting of the lamp current. At the lower temperatures, the total photocurrent is principally a photocurrent 128 arising from the photon flux from the warm lamps and passing through the wafer. However, as represented by line 130, there is a constant background radiation, for example, stray radiation and warm chamber parts. At higher temperatures, there is an increasing contribution from the blackbody radiation of the wafer itself, represented by line 132. The cross over for the lamp and wafer blackbody contributions occurs at a temperature of about 400° C., which is near the lower end of the region at which the radiation pyrometer becomes effective.

Figure 5:
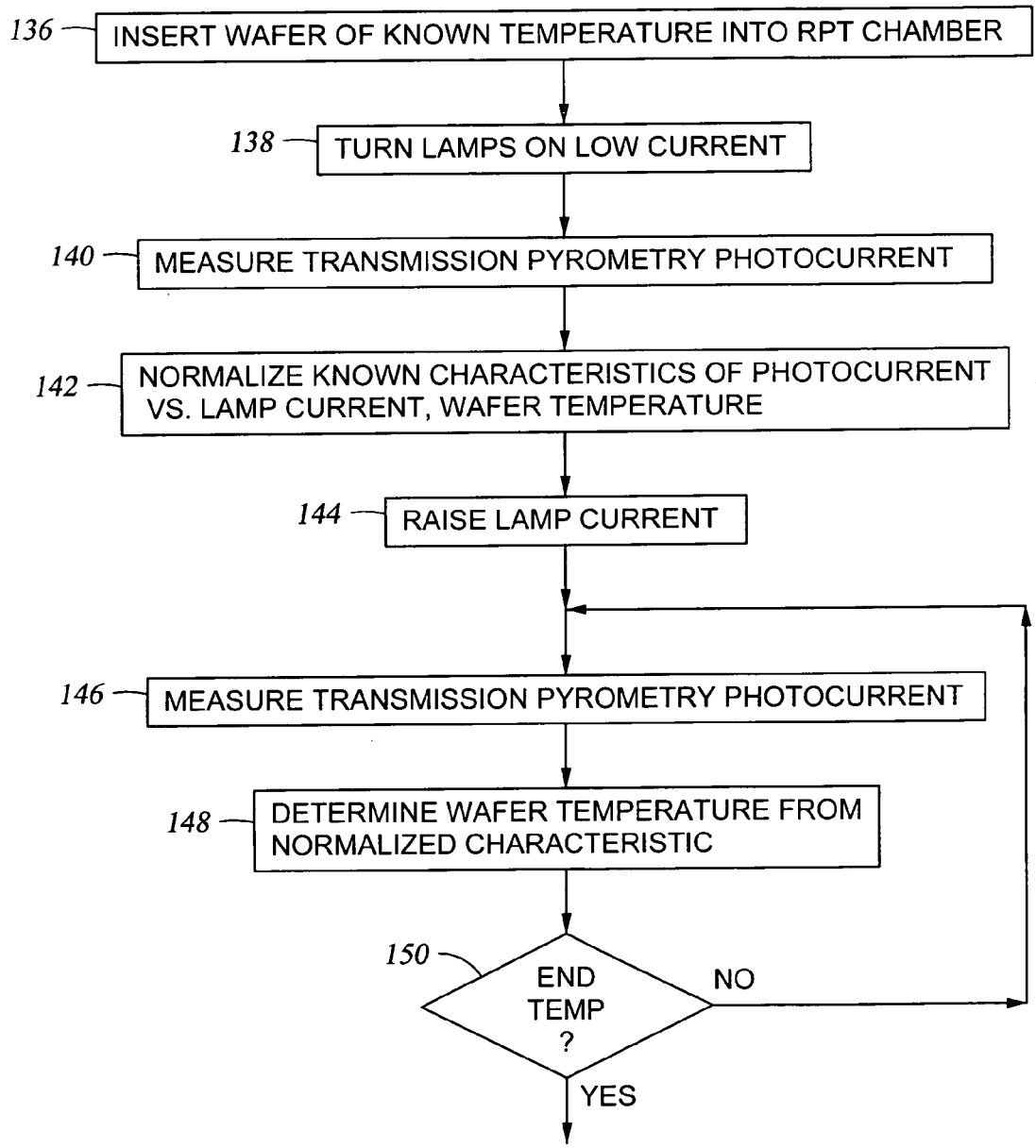
FIG. 5 is a process flow diagram for a fundamental method of using a transmission pyrometer to measure temperature of a wafer in an RTP chamber.

One aspect of the invention depends upon a known dependence of the transmission pyrometer photocurrent upon lamp current and wafer temperature, which may be referred to as the pyrometer characteristics. The wafer thickness for production wafers is tightly controlled, for example, 0.75±0.02 mm for 300 mm wafers, and is thus assumed to be a known quantity. A basic algorithm for a controllable heating of the wafer is illustrated in the process flow diagram of FIG. 5. In step 136, a wafer of known temperature is inserted into the RTP chamber and in step 138 the lamps are turned to a set low current, for example, about 20% of the final lamp current. In step 140, the photocurrent from the transmission pyrometer is measured before the wafer has time to significantly warm in the lamp radiation. This measurement is done with known values of the lamp current and wafer temperature and enables the known characteristics to be properly normalized.

In step 142, the known but unnormalized characteristics of photocurrent vs. lamp and wafer temperature are normalized. This may be done in a number of ways, but the easiest procedure applies a scaling factor to the photocurrent output of the photodetector to bring the measured photocurrent in line with the value of the unnormalized photocurrent characteristic at the initial wafer and lamp temperatures. Thereafter, all measured photocurrent values are scaled.

Establishing the initial temperature of the wafer may include different procedures. The incoming wafer should be at the ambient temperature of the transfer chamber from which the wafer is loaded, for example, 25° C. However, the wafer may heat up during the temperature characterization step beginning after the lamps have been turned on, a process taking about 8 s for 15% lamp power and may lead to errors of about 10° C. although the temperature increase depends upon wafer type. The temperature increase during the characterization step is achieved by measuring the lamp intensity after it's turned on and modeling the thermal response of a given wafer to that intensity profile. An initial temperature of 40° C. may be assumed for the modeling. Once we know how much the wafer heats for a given lamp power and resultant intensity profile, the wafer temperature can be accurately measured by the end of the characterization period and provide an accurate initial wafer temperature for the subsequent pyrometry.

Thereafter in step 144, the lamp current is raised to at least an initial pre-heat value. Thereafter, in step 146, the photocurrent from the transmission pyrometer is measured for the same wafer and the raised lamp current. In step 148, the wafer temperature is determined from the measured photocurrent and the normalized characteristics. Steps 146, 148 are repeated until it is determined in step 150 that some final pre-heat wafer temperature has been reached.

The required lamp and wafer characteristics can be established in a number of ways. It is possible to measure the pyrometer photocurrent for a large number of combinations of lamp current and wafer temperature and possibly wafer thickness and use these experimental values to thereafter relate photocurrent to wafer temperature. A normalization is still believed to be desirable to account for wafer variations and changes in the chamber conditions including different lamps, etc.

A preferred approach relies upon a fairly complete understanding of the dependence of photocurrent upon electrical measurements of the lamps and the temperature dependence of transmittance through a silicon wafer and the response of the photodetector. The photocurrent $I_{PD}$ for a transmission pyrometer depends principally upon the wafer temperature $T_W$ and the lamp temperature $T_L$ and may be expressed as $$I_{PD} = \Omega \cdot \int_{\lambda_1}^{\lambda_2} R(\lambda) \cdot t(\lambda, T_W, x) \cdot L(\lambda, T_L) d\lambda, \quad (2)$$

where $\lambda_1$ and $\lambda_2$ are the limits of integration indicating the spectral limits of the responsivity of the photodetector, which may extend from 0.8 to 1.7 µm, $R(\lambda)$ is the response function of the photodetector including any filter that is used, $L(\lambda, T_L)$ is the radiation intensity spectrum of the lamp at lamp temperature $T_L$, and $\Omega$ is a normalization factor to account for differences in background radiation, reflectivity on the top surface of the wafer, view factor of the transmission channel, and differences in the lamp radiation intensity. Proper normalization for reflectivity on the top wafer surface permits different types of wafers having different horizontal and vertical structures to be processed without separate optimization of the RTP pre-heating for each type of structure. Instead, the single normalization measurement in large part accounts for such differences which principally affect the top-surface reflectivity.

The lamp radiation intensity L is a function of the power dissipated in the lamp filament and hence of the temperature $T_L$ of the lamp, the emissivity $\epsilon_L(\lambda, T_L)$ of the material used for the filament, and a correction $\delta(\lambda, T_L)$ to the emissivity due to coiling of the lamp filament. The lamp temperature $T_L$ may be determined from an empirical expression for tungsten filaments given by $$T = \alpha \cdot R^{0.831}{}_L, \quad (3)$$

where a is a constant that may be determined by spectral measurements for radiation emitted by a class of lamps and $R_L$ is the resistance of the lamp filament, which may be determined by the instantaneous applied voltage and current feedback from the SCR drivers for the lamps. With the knowledge of the filament temperature, the radiation intensity of the lamps may be calculated from $$L(\lambda,T_L)=L_{BB}(\lambda,T_L)\epsilon(\lambda,T_L)\delta(\lambda,T_L), \quad (4)$$

where $L_{BB}$ is the Planckian blackbody radiation spectrum from a surface at temperature $T_L$, $$L_{BB}(\lambda, T) = \frac{c_1}{\lambda^5}(e^{c_2/\lambda T} - 1)^{-1}, \quad (5)$$

where $c_1$ and $c_2$ are the well known radiation constants having respective values of $3.742 \times 10^{-16}$ Wm$^2$ and 0.1439 mK. The emissivity $\epsilon$ of tungsten is well known as a function of both temperature and wavelength. The coiling and correction factor $\delta$ needs to be calculated or alternatively measured for each class of lamp.

The transmissivity $\tau$ through the silicon wafer having a thickness x at temperature $T_W$ is given by $$\tau(\lambda, T_W, \chi) = e^{-\alpha(\lambda, T_W)\chi}, \quad (6)$$

where $\alpha$ is the absorption coefficient of silicon at wavelength $\lambda$ and temperature $T_W$. The absorption coefficient may be measured or can be calculated from the model described by Timans in "Emissivity of silicon at elevated temperatures," *Journal of Applied Physics*, vol 74, no. 10, 15 Nov. 1993, pp. 6353–6364. The Timans model accounts for the absorption by phonons and free carriers and shows good agreement with measured absorptivity for lightly doped silicon. The Timans reference is also valuable for a general discussion of pyrometry.

Finding a closed expression which inverts the integral of Eqn. (2) to find wafer temperature based upon a measured photocurrent is computationally challenging and difficult to implement for real-time adjustment. Instead, it is preferred to compile a look-up table. For example, a two-dimensional table is constructed with lamp filament temperature $T_L$ on one axis and wafer temperature $T_W$ on the other axis. The calculated, unnormalized values of the photocurrent occupying the cells of the table.

The initial photocurrent measurement at a known wafer temperature $T_W$ and electrically measured lamp filament temperature $T_L$ correlates the unnormalized calculated photocurrent values in the table with a measured photocurrent and thus allows the normalization constant $\Omega$ to be determined for the entire table. Although it is possible to normalize all entries in the table, it is instead preferred to scale all measured photocurrents at the output of the photodetector by the now known normalization constant.

During processing of the wafer after the calibration step, the photocurrent from the transmission pyrometer is measured at known electrical measurement of the current and voltage of the lamp power supplies, which in view of Eqn. (3) provide a lamp temperature. The look-up table is then consulted to correlate the measured and scaled photocurrent at the known lamp temperature with a wafer temperature. Interpolation may be performed between tabulated photocurrents and, if necessary, between lamp temperatures. Other methods are available for storing and retrieving the characteristics of photocurrent versus lamp and wafer temperature. Each column of the table may be represented by the coefficients of a polynomial, power series, or other mathematical function relating photocurrent to wafer temperature for a given lamp temperature. Such a mathematical function is easily calculated on a real-time basis. Alternatively, the entire table could be converted to a two-variable power series. If desired, the polynomial or power series could include photocurrent as a variable with wafer temperature as the value of the polynomial.

Figure 6:
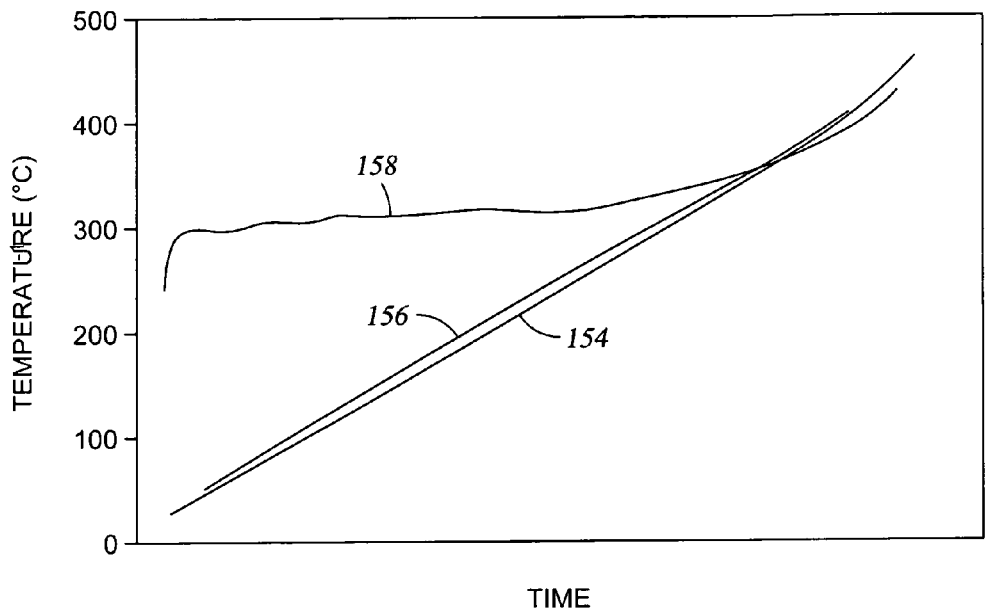
FIG. 6 is a graph comparing the performance of transmission and radiation pyrometers as a silicon wafer heats up.

The invention was verified with a silicon photodiode facing one of the lamps through the backside of the wafer and having a narrow field of view and no additional filtering beyond the approximate 1 μm lower limit of silicon photodiode responsivity and the absorption edge being below about 1.2 μm for the temperatures of interests. A separate conventional radiation pyrometer faced the same general area of the wafer but had a filter and a wider field of view. Additionally, a thermocouple was implanted in a bare wafer to measure its true temperature during the verification test. The results are shown in the graph of FIG. 6, which shows temperatures determined by different methods as a function of time after the lamps were turned on. Line 154 shows the temperature measured by the thermocouple. Line 156 shows the wafer temperature determined by the transmission pyrometer of the invention and operated in conjunction with the previously described look-up table. Line 158 shows the temperature determined by the conventional radiation pyrometer. At all temperatures, the transmission pyrometer measures a temperature relatively close to that of the thermocouple. At temperatures below about 300° C., the conventional radiation pyrometer fails to accurately measure the wafer temperature, but at higher temperatures its performance is adequate. As is further shown in FIG. 4, the transmission pyrometer of that design has a flattened response above about 350 or 400° C. Therefore, it is desirable to rely upon the transmission pyrometer at temperatures less than a transition temperature of about 350° C. and to rely upon the radiation pyrometer at higher temperatures. However, the transition temperature may vary depending upon the designs of the two pyrometers, but the present designs indicate a transition temperature of between 300 and 400° C.

There are at least two processes to which the invention may be applied, almost room-temperature pyrometry and open-loop tuning, also referred to as pre-heating. Almost room-temperature pyrometry according to the invention uses preferably multiple radially arranged transmission pyrometers within the feedback loop of a thermal control system in an architecture similar to that used with radiation pyrometry at higher temperatures. Thereby, accurate thermal control is possible at temperatures below 250° C., as is contemplated for several advanced integrated circuit structures. It would be desirable for such low-temperature operation to fabricate photodetectors and filters more appropriate for the longer wavelengths, e.g. InGaAs photodetectors and interference filter, since the described silicon photodiode exhibits poor performance at wafer temperatures of greater than about 300° C. As stated before, it would be desirable that an RTP chamber have the capability of both low-temperature and high-temperature processing with thermal feedback control operable at all wafer temperatures.

For low-temperature pyrometry, it may be desirable to provide a light source for the transmitted radiation separate from the heating lamps. The light source may be a laser or LED, but it is believed that a separate low-intensity incandescent bulb provides better long term stability.

Figure 7:
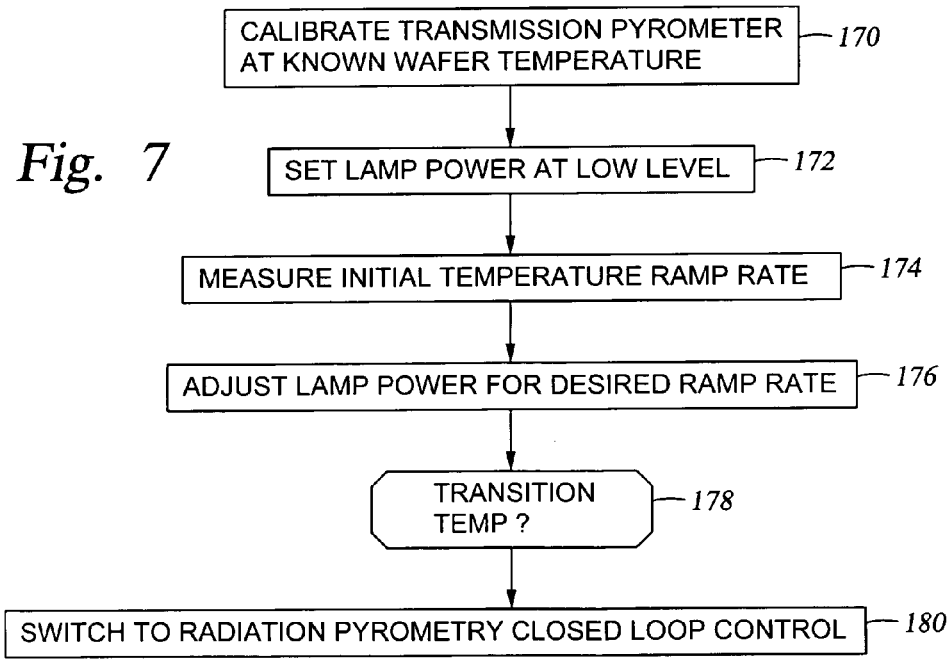
FIG. 7 is a process flow diagram for another method of using a transmission pyrometer to control heating rate in an RTP chamber including adjusting lamp power in view of a measure initial temperature ramp rate.

The invention may also be applied in conjunction with standard high-temperature RTP to more closely control the pre-heat phase (also called open loop tuning) without involvement of the radiation pyrometers. A simple preheating process is illustrated in the flow diagram of FIG. 7. After a wafer at known temperature is inserted into the RTP reactor, in step 170, the transmission pyrometer is calibrated by establishing the normalization factor for the look-up table or other method of storing the characteristics of the system. In step 172, the RTP lamps are set to a predetermined low power level, for example, at 15% of full high-temperature levels, which produces a relatively slow heating rate of less than 10° C./s. In step 172, the calibrated transmission pyrometer measures the wafer temperature at least twice after the lamps have been set to their low power level and thereby measures the initial ramp rate of the temperature as the wafer heats during the interval between the two measurements. In step 176, the power supply controller calculates adjusted lamp power levels which will change the temperature ramp rate from the initially measured one to a desired temperature ramp rate, which may a set value in the range of 10 to 20° C./s. Thereafter, the pre-heating continues until step 178 determines that the wafer temperature has reached a transition temperature at which the control is switched in step 180 to closed loop control primarily relying upon the radiation pyrometers, as is done in conventional high-temperature RTP control systems.

The pre-heating after adjustment for the initial ramp rate may be performed in a number of ways. It may rely simply upon elapsed time since the lamp power has been readjusted. Either the transmission pyrometer or the radiation pyrometer may be used to detect when the transition temperature has been reached, a temperature to which both pyrometers are typically sensitive. For even closer control, the transmission pyrometer may be used in a closed loop control system for the pre-heating phase to dynamically adjust the lamp currents to maintain the desired temperature ramp rate during the pre-heating. Further, it is possible to adjust the desired ramp rate for different portions of the pre-heating phase.

Although the above descriptions have focused on a single transmission pyrometer and have mentioned only one lamp power setting, accuracy is improved if multiple transmission pyrometers are positioned at different radii and that some differential zone heating be utilized. For example, one transmission pyrometer may point near the wafer center, a second point near the transition from the wafer to the edge ring, and a third one point only on the edge ring. The lamps may then be divided into at least three similar zones for the pre-heating. In the initial ramp rate adjustment of FIG. 7, three initial temperature ramp rates are measured from the three transmission pyrometers. Then, the lamps in the different heating zones are separately readjusted to obtain typically a common desired ramp rate with perhaps some interpolation in narrow intermediate zones.

The transmission pyrometers of the invention are useful also for the initial pre-heating in which the wafer is warmed to the temperature of the edge ring, for example, about 200° C., while it is supported by the lift pins. Once the wafer has attained this temperature, the lift pins lower it onto the edge ring, which then begins rotating. Radiation pyrometers are nearly useless in this regime, particularly since there is significant light leakage from the lamps around the suspended wafer to the underlying pyrometers. Although the previously described transmission pyrometers of Hunter were used for a similar function, they were embedded in the lift pins and thus not readily available for monitoring pre-heating temperatures above 200° C.

It is possible to provide separate radiation and transmission pyrometers coupled to different apertures in the reflector plate. However, it is convenient to integrate the two pyrometers by modifying the radiation pyrometer of Adams et al. to include an angled partial reflector prior to the radiation pyrometer filter. The reflected radiation is directed to an unfiltered silicon photodetector, which thus acts as the transmission pyrometer.

Figure 8:
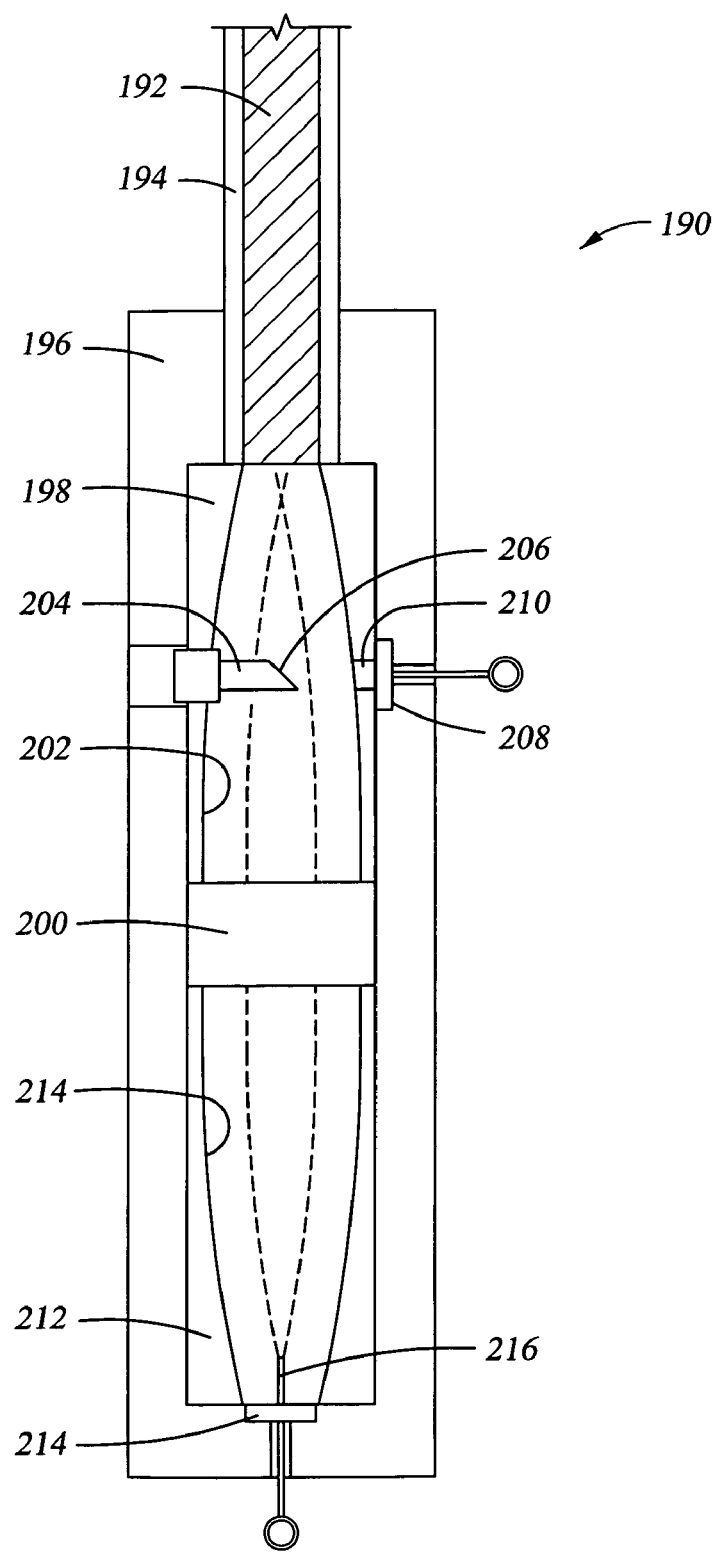
FIG. 8 is a cross sectional view of a combined radiation and transmission pyrometer usefully applied to rapid thermal processing.

An example of a dual pyrometer 190, illustrated in cross section in FIG. 8, is adapted from Adams et al., which should be referenced for details and other embodiments. A sapphire light pipe 192 and metal sleeve 194 support the pyrometer 190 at the bottom of the RTP reflector plate. The pyrometer is formed inside a housing 196 which accommodates a collimator 198 having a reflective inner wall 22 flaring radially outwardly from an axial aperture 199 in the collimator 198 adjacent the output of the light pipe 192 to collimate the light pipe radiation to a narrow-band filter 200, typically composed of a multi-layer interference filter. The narrow-band filter 200 is supported in the housing 196 and associated with the radiation pyrometer. However, an adjustable gold-plated pin 204 projects from the collimator wall 202 and has a slanted reflective face 206, acting as a beam splitter, directing part of the radiation from the light pipe 192 towards a photodetector 208 facing the reflective face 206 through an aperture 210 in the collimator 198. The photodetector 208 may be a silicon photodiode, in which case it alone may act as the transmission pyrometer for lower wafer temperatures. However, for somewhat higher wafer temperatures, the photodetector 208 may have a longer-wavelength response, such as an InGaAs photodiode, in which case an unillustrated separate transmission pyrometer filter is interposed between the photodetector 208 and the beam splitter 206. The remainder of the radiation passes the beam splitter 206 and is filtered by the radiation pyrometer filter 200 before entering the wide narrow end of a concentrator 212 having an inwardly tapered reflective wall 214 concentrating the filtered radiation toward a second photodetector 214 exposed through a narrow axial aperture 216 at the end of the concentrator 212. The photodetector 214 completes the radiation pyrometer and is typical implemented as a silicon photodiode. Separate electrical leads from the two photodetectors 208, 214 are led to the photodetector power supplies and to the lamp power supply controller to supply the two pyrometer photocurrents.

The described structure advantageously uses existing designs for the RTP reflector plate and its apertures and light pipes. Other structures and other types of beam splitters may be used. Sensitivity is improved with a wavelength-selective beam splitter.

The invention thus provides better low-temperature control of an RTP process, whether it involves an effective thermal process at the low temperature or involves the pre-heating required to attain a higher temperature at which radiation pyrometry is conventionally used. The transmission pyrometer can be easily and economically incorporated into existing designs of high-temperature RTP chambers to extend their temperature range of operation and more closely control the pre-heating phase.

The invention claimed is:

1. A thermal processing system, comprising:
   a controllable radiant heat source;
   a support member configured to support a substrate thereupon in opposition to said radiant heat source;
   at least one transmission pyrometer disposed on an opposite side of said support member while said substrate is supported thereupon and configured to detect radiation from said radiant heat source; and
   a power supply control system controlling an amount of power delivered to said radiant heat source in response to an output of said at least one transmission pyrometer.

2. The processing system of claim 1, wherein there are a plurality of said transmission pyrometers disposed at different radial positions with respect to a center of said substrate.

3. The processing system of claim 2, wherein one of said transmission pyrometers is directed toward a central portion of said substrate and another of said transmission pyrometers is directed to said support member.

4. The processing system of claim 1, wherein said substrate comprises a silicon wafer.

5. The processing system of claim 1, wherein said power supply control system includes:
a memory stored with unnormalized characteristics relating photocurrents produced by said at least one transmission pyrometer for multiple values of a temperature of said wafer and multiple values of a variable representative of a temperature of a filament of a lamp in said radiant heat source;
means for measuring a normalizing photocurrent from said transmission pyrometer for a set temperature of said filament and a known temperature of said wafer; and
means for normalizing said stored unnormalized characteristics according to said measured normalizing photocurrent.

6. The system of claim 5, wherein said memory comprises a look-up table having entries for photocurrents calculated for a plurality of said temperatures of said wafer and a plurality of said variable representative of said temperature of said filament.

7. A thermal processing system, comprising:
a controllable radiant heat source for heating a substrate disposable on a front side thereof;
at least one transmission pyrometer disposed on a side of said substrate opposite said radiant heat source; and
a power supply control system controlling an amount of power delivered to said radiant heat source and including
a memory stored with unnormalized characteristics relating photocurrents produced by said transmission pyrometer for multiple values of a temperature of said substrate and multiple values of a variable representative of a temperature of a filament of a lamp in said radiant heat source,
means for measuring a normalizing photocurrent from said transmission pyrometer for a set temperature of said filament and a known temperature of said substrate; and
means for normalizing said stored unnormalized characteristics according to said measured normalizing photocurrent.

8. The system of claim 7, wherein said memory is stored with values photocurrents calculated for a plurality of said temperature of said substrate and a plurality of values of said variable.

9. The system of claim 7, wherein said substrate comprises a silicon wafer.

10. A thermal processing system, comprising:
a radiant heat source including incandescent lamps;
a support for supporting a wafer in opposition to said radiant heat source;
a reflector plate disposed on a side of said support opposite said radiant heat source;
a light pipe having an input end optically coupled through an aperture in said reflector plate, supported by the reflector plate, and directed at said wafer;
an optical beam splitter receiving an output of said light pipe and dividing said output into first and second beams;
a transmission pyrometer receiving said first beam; and
a radiation pyrometer receiving said second beam.

11. The system of claim 10, further comprising a controller receiving outputs of said transmission and radiation pyrometers and in response controlling power supplied to said lamps.

12. A process for heating a substrate, comprising the steps of:
at a first level of power applied to a radiant heat source irradiating said wafer, measuring an initial temperature ramp rate with a transmission pyrometer sensitive to radiation from said radiant heat source, wherein the transmission pyrometer measures at least two temperatures of said wafer to thereby establish the initial temperature rate by at least one interval between when the at least two temperatures are measured; and
based upon said initial temperature ramp rate, applying a second level of power to said radiant heat source such that said substrate is heated at a desired temperature ramp rate.

13. The process of claim 12, wherein said desired temperature ramp rate is greater than said initial temperature ramp rate.

14. The process of claim 12, further comprising:
monitoring a temperature of said wafer while said second level of power is applied to said radiant heat source; and
when said monitored temperature reaches a predetermined transition temperature, initiating closed loop control of power supplied to said radiant heat source using a radiation pyrometer.

15. The process of claim 12, wherein said substrate comprises a silicon wafer.

16. A dual pyrometer, comprising:
a beam splitter receiving a signal from a light guide and dividing it into a first beam reflected from a reflective face and a second beam not reflected from the reflective face;
a transmission pyrometer receiving said first beam; and
a radiation pyrometer receiving said second beam.

17. The pyrometer of claim 16, further comprising:
a housing accommodating said beam splitter and having an entrance aperture receiving radiation from said light guide;
wherein said transmission pyrometer includes a first photodetector supported by said housing;
wherein said radiation pyrometer includes a second photodetector supported by said housing and a first optical filter supported by said housing; and
wherein said beam splitter is disposed on an optical path between said entrance aperture and said filter.

18. The pyrometer of claim 17, wherein both said first and second photodetectors are silicon photo diodes.

19. The pyrometer of claim 18, wherein substantially no filtering is performed on an optical path between said beam splitter and said first photodetector.

20. The pyrometer of claim 17, wherein said transmission pyrometer comprises an InGaAs photodiode and a second optical filter disposed on an optical path between said beam splitter and said InGaAs photodiode.

21. The pyrometer of claim 17, further comprising:
a collimator receiving an output of said light guide on a narrow end thereof and disposed adjacent said filter on a wide end thereof, wherein said beam splitter is disposed between said narrow end and said filter and wherein said first photodetector receives light from said beam splitter through an aperture in a side wall of said collimator; and
a concentrator receiving radiation through said filter through a wide end thereof, wherein said second photodetector receives light through a narrow end of said concentrator.

22. A dual pyrometer, comprising:
   a beam splitter receiving a signal from a light guide and dividing it into a first beam and a second beam;
   a transmission pyrometer receiving said first beam; and
   a radiation pyrometer receiving said second beam,
   wherein said transmission and radiation pyrometers are configured to detect a temperature of a silicon wafer.

23. The processing system of claim 1, wherein the at least one transmission pyrometer is configured to measure a temperature of the said substrate.

24. The processing system of claim 7, wherein the at least one transmission pyrometer is configured to measure a temperature of the said substrate.

25. The system of claim 10, further comprising lift pins movably disposed in apertures in the reflector plate for selectively supporting the wafer, wherein the light pipe is mechanically independent of the lift pins.

26. The system of claim 10, further comprising a flexible light guide coupling the light pipe and the optical beam splitter.

27. The process of claim 12, further comprising calibrating the transmission pyrometer by exposing it to a wafer of known temperature.

* * * * *